United States Patent [19]
Madan et al.

[11] Patent Number: 5,016,562
[45] Date of Patent: May 21, 1991

[54] MODULAR CONTINUOUS VAPOR DEPOSITION SYSTEM

[75] Inventors: Arun Madan, Golden; Bolko Von Roedern, Wheat Ridge, Colo.

[73] Assignee: Glasstech Solar, Inc., Perrysburg, Ohio

[21] Appl. No.: 307,836

[22] Filed: Feb. 7, 1989

Related U.S. Application Data

[63] Continuation-in-part of Ser. No. 186,633, Apr. 27, 1988, abandoned, which is a continuation-in-part of Ser. No. 946,855, Dec. 29, 1986, abandoned.

[51] Int. Cl.$^5$ .............................................. C23C 16/50
[52] U.S. Cl. ..................................... 118/719; 118/723
[58] Field of Search ................................. 118/719, 723

[56] References Cited

U.S. PATENT DOCUMENTS

| | | | |
|---|---|---|---|
| 4,015,558 | 4/1977 | Small | 118/719 |
| 4,048,955 | 9/1977 | Anderson | 118/725 |
| 4,405,435 | 9/1983 | Tateishi | 118/719 |
| 4,592,306 | 6/1986 | Gallego | 118/719 |

FOREIGN PATENT DOCUMENTS

| | | | |
|---|---|---|---|
| 58-196063 | 11/1983 | Japan | 118/50.1 |
| 59-208791 | 11/1984 | Japan | |

Primary Examiner—Richard Bueker
Attorney, Agent, or Firm—Brooks & Kushman

[57] ABSTRACT

A modular continuous vapor deposition system for the fabrication of semiconductor devices having a plurality of deposition modules isolated from each other by isolation modules which prevent the cross contamination of the different processing gases used in the deposition modules. Each of the deposition modules has a flow of a decomposable processing gas therethrough at a desired pressure, and means for generating a continuous glow discharge. The glow discharge decomposes the processing gas to deposit a layer of amorphous semiconductor material on the discrete substrate sheets as they are transported through each of the deposition modules. A plurality of gate valves effectively seal the interfaces between adjacent modules to isolate them from their immediate neighbors and are opened in a predetermined sequence to allow the substrate sheets to be transported from one module to the next. The isolation modules are connected to a vacuum source and a back-fill gas source. A control coordinates the activation of the gate valves, the vacuum source and the back-fill gas source so that the substrate sheets can be uninterruptedly transported through the system while maintaining the glow discharge continuous and gas pressure in each deposition module at the desired pressure.

16 Claims, 2 Drawing Sheets

MODULAR CONTINUOUS VAPOR DEPOSITION SYSTEM CROSS REFERENCE TO RELATED APPLICATION

This application is a continuation-in-part of U.S. Ser. No. 186,633, filed on Apr. 27, 1988, now abandoned, which is a continuation-in-part of U.S. Ser. No. 946,855 filed on Dec. 29, 1986 now abandoned, and entitled Multi-Chamber Continuous Vapor Deposition System.

TECHNICAL FIELD

The present invention relates to a modular continuous vapor deposition system for depositing amorphous silicon on discrete sheets of a substrate to fabricate semiconductor devices as the sheets pass through the system.

BACKGROUND ART

Since the discovery by the University of Dundee Group in the early 1970's that high quality, low density of states amorphous silicon could be produced from the decomposition of silane (SiH4) gas in a glow discharge, amorphous silicon semiconducting devices have emerged as a dominant force in the marketplace.

Amorphous silicon's initial attraction as an electric power source was that it can be fabricated over large area substrates as required by photovoltaic and thin film transistor applications. Large area substrates on which amorphous silicon is deposited include glass plates, large plastic sheets, flexible non-conductive substrates such as plastic ribbons, and flexible metal foil substrates, such as stainless steel.

In order to perform the aforementioned depositions at a commercially viable rate, the industry realizes that a continuous production system must be utilized. However, large area substrates suffer from decreased conversion efficiency, and increase the difficulty by which continuous processes may be employed to produce amorphous silicon semiconducting devices.

One way to sharply reduce the panel cost of amorphous silicon solar cells is to capitalize on the fact that series-connected cells covering large areas can be manufactured as monolithic devices. Because glass substrates are insulating, a monolithic series-connected panel can be constructed with ease.

The fabrication of a complete photovoltaic panel requires a multi-step process integrating many established technologies. Obtaining acceptable panel cost ultimately depends on reducing processing costs, improving yield and increasing throughput at virtually every stage, with reduced pin hole formation a priority.

The most conventional technique for the production of amorphous silicon cells is the "batch" type process which is inherently slow and suffers from sever cross-contamination due to boron and phosphorous. This leads to a system which yields low throughput as well as low over all panel performance. Consequently, the cost of the panels is high. While the "batch" type process was viable in the late 1970's, it is no longer a state-of-the-art approach to mass production.

In the "roll-to-roll" approach, two types of substrates are under investigation--polyamide and stainless steel. These substrates could have major drawbacks for several reasons. Under the "roll-to-roll" approach, a roll of material is fed through the system, so that P, I, and N-layers are deposited sequentially. This, by necessity, results in cross-contamination due to boron (from the P-layer deposition section) and phosphorous (from the N-layer deposition section) and leads to degradation in the opto-electronic properties of the I-layer and consequently in the device-panel performance.

Although various schemes exist to minimize cross-contamination, it should be recognized that even one part per million of boron (or phosphorous) severely affects the properties of the I-layer.

The "roll-to-roll" and the "batch" approaches either lead to a low throughput or cross-contamination problems, leading to low performance cells. The cell performance is inexplicably linked to the density of localized states which are in turn related to impurities and cross-contamination due to boron and phosphorous. It has been found that to obtain high performance cells with reproduceability, one of the key factors is a multi-chamber approach.

U.S. Pat. 4,492,605 issued to Ishihara et al. on Jan. 8, 1985 discloses a continuous in-line deposition system for coating large area substrates with amorphous silicon. However, the deposition of amorphous silicon, as taught by Ishihara, is merely incidental to the movement of the substrate through the system. U.S. Pat. No. 4,318,938 issued to Barnett et al. on Mar. 9, 1982, discloses a technique for manufacturing solar cells by a continuous process suitable for large-scale manufacture which involves providing a reel of thin metal foil substrate and forming on the substrate a series of layers operative to form a photovoltaic junction, short prevention blocking layers, contacts and integral encapsulation. A collector of cadmium sulfide deposited with an absorber-generator of copper sulfide is described.

U.S. Pat. No. 4,405,435 issued to Tateishi et al. on Sept. 20, 1983 discloses an apparatus for performing continuous treatment in vacuum including an inlet chamber, a first intermediate chamber, at least one vacuum-treating chamber, a second intermediate chamber and a withdrawing chamber arranged in a sequential order in a direction in which base plates are successively transferred. A conveyor device for conveying each base plate in a horizontal direction through an opening device is mounted in each of the chambers and an evacuating device is also mounted in each chamber. The disclosure is specific to a continuous sputtering apparatus.

U.S. Pat. No. 4,438,723 issued to Cannella et al. on Mar. 27, 1984 discloses a multiple chamber deposition and isolation system and method including a system to form a body of material on a substrate having at least two layers of different composition with minimized cross-contamination between the respective deposition environments in which the layers are deposited. A continuous flexible metal foil substrate is processed through the multiple chamber system.

U.S Pat. No. 4,593,644 issued to Hanak on June 10, 1986 discloses a continuous in-line deposition system having a vacuum chamber for coating large substrates. The apparatus also includes load lock chambers for entry of substrates supported by carriers into the vacuum chamber and for subsequent exiting after the coating. The carriers transport pairs of substrates with their principal faces held in a plane that is both parallel to the electric field of the glow discharge reaction and perpendicular to the direction of motion of the substrates through the apparatus. A transportation means is included for holding the substrate so that a principal face of each is perpendicular to the longitudinal axis and for imparting continuous motion to the substrate along the longitudinal axis and through each of the subchambers.

DISCLOSURE OF INVENTION

It is an object of the present invention to provide an improved continuous vapor deposition system for depositing amorphous silicon on discrete sheets of a substrate to fabricate semiconductor devices, including photoresponsive cells as the sheets pass through the system.

In carrying out the above object, the continuous vapor deposition system of the invention consists of a plurality of individual modules, at least one of which is for depositing amorphous silicon on discrete sheets of a substrate. In its most basic contemplated construction, the system includes: a first isolation module for receiving discrete sheets of the substrate onto which the amorphous silicon is to be deposited; a deposition module connected to the first isolation module for depositing amorphous silicon on the substrate sheets as they are passed therethrough by decomposition of a processing gas by a continuous glow discharge; and at least a second isolation module for receiving the substrate sheets from the deposition module after the deposition of the amorphous silicon on the substrate sheets.

Conveyors in each of the modules convey the substrate sheets through the system. The conveyor in each module has a separate drive that operates independently of the drives in the other modules such that conveyance of the substrate sheets from the first isolation module into the deposition module can take place independently of conveyance of the substrate sheets from the deposition module into the second isolation chamber.

A plurality of independently operable gate valves isolate the modules, one from the other and are operative to open, permitting conveyance of discrete substrate sheets: (a) into the first isolation module, (b) from the first isolation module to the deposition module, (c) from the deposition module into the second isolation module, and (d) out of the second isolation module.

The system also includes a source of back-fill gas for intermittently supplying a back-fill gas to the first and second isolation modules.

In addition, the system includes a vacuum source for intermittently evacuating the first and second isolation modules to remove gas therefrom before the substrate sheets are conveyed into the first module and out of the second isolation modules.

A control of the system coordinates operation of the individual conveyors in each module, the gate valves, the back-fill gas source to the first and second isolation modules, and the vacuum source for evacuating the first and second isolation modules in predetermined sequences to prevent contamination and to maintain the gas pressure in the deposition module generally constant as each substrate sheet is conveyed into, through, and out of the deposition module. During the conveyance of the substrate sheets in and out of the deposition module, the decomposition of the gas by the glow discharge is uninterrupted, enhancing uniformity of the amorphous silicon deposited on the discrete substrate sheets, and avoiding the non-uniformities in the deposited amorphous silicon resulting from the commencement and termination of the glow discharge deposition.

The preferred embodiment of the modular continuous vapor deposition system includes a P-type deposition module for depositing amorphous silicon having P-type conductivity (P-type amorphous silicon) onto the substrate sheets, an I-type deposition module for depositing intrinsic (I-type) amorphous silicon onto the substrate sheets, and a N-type deposition module for depositing amorphous silicon having N-type conductivity (N-type amorphous silicon) onto the substrate sheets.

In the preferred embodiment, the modular continuous vapor deposition system includes a load lock module associated with at least one of the isolation modules. This load lock module also has an independent conveyor with an independent drive, independently operable gate valves for permitting conveyance of substrate sheets into the load lock module and from the load lock module into the isolation chamber module, and the load lock module is also in communication with the vacuum source. The control of the system coordinates the operation of the individual conveyors in each module, the gate valves, and the vacuum source with the operation of the deposition, isolation, and load lock modules. As disclosed, the system includes both an entrance load lock module through which the substrate sheets enter the system and an exit load lock module through which the substrate sheets exit the system.

The invention also contemplates the method for plasma-enhanced vapor deposition of amorphous silicon on discrete sheets of a substrate in accordance with the operation of the system. This method is performed as described in the following steps: (1) A discrete substrate sheet is loaded into the load lock module, then the load lock module is evacuated. (2) At the same time, the first isolation module is evacuated of any gas contained therein. (3) The gate valve isolating the first isolation module from the load lock module is then opened and the discrete substrate sheet is transferred to the first isolation module. (4) Thereafter, the gate valve isolating the first isolation module from the load lock module in which the sheet is located is closed and the first isolation module is filled with a back fill gas to a pressure substantially equal to the pressure in the deposition module. (5) The gate valve between the deposition module and the first isolation module is then opened and the substrate sheet is transferred from the first isolation module into the deposition module. (6) As a sheet passes into the deposition module, the deposition of the amorphous silicon is uninterrupted and the glow discharge decomposition of the processing gas is continuous for the duration of time the system is operating. (7) The second isolation module is now filled with back fill gas and the gate valve isolating the deposition module from the second isolation module is then opened to permit conveyance of the now coated substrate sheet from the deposition module into the second isolation module. (8) After the coated sheet is in the second isolation module, the gate valve located between the deposition module and the second isolation module is closed and the second isolation chamber and the exit load lock module are evacuated. (9) Subsequently, the gate valve at the other end isolation module is opened to permit conveyance of the substrate sheet therefrom. The control system controls the operation of the gate valves so that in no instance are both gate valves to any isolation chamber in an open state at the same time. However, both gate valves to the deposition chamber may be open at any given time as discrete sheets are passed into and out of the deposition chambers.

The method described above is performed at the P-type vacuum deposition module, the I-type vacuum deposition module, and the N-type vacuum deposition module.

The objects, features, and advantages of the present invention are readily apparent from the following detailed description of the best mode for carrying out the invention when taken in connection with the accompanying drawing.

BEST MODE FOR CARRYING OUT THE INVENTION

Figure 1:
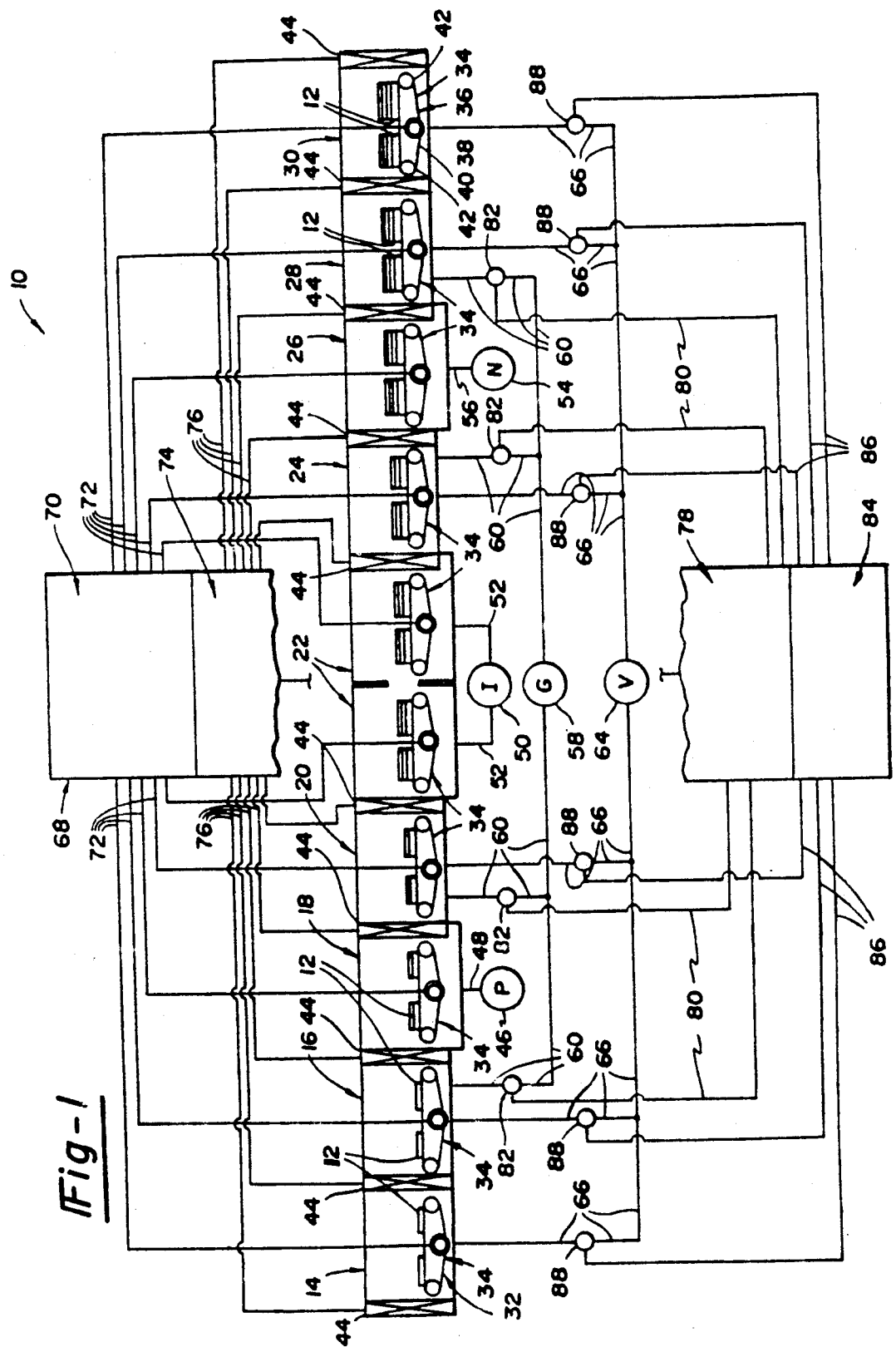
FIG. 1 is a schematic view of a modular continuous vapor deposition system for depositing amorphous silicon on discrete sheets of a substrate.

With reference to FIG. 1 of drawings, a serially connected modular continuous vapor deposition system is indicated generally by 10 and is operable to deposit amorphous silicon on discrete sheets of a glass substrate 12. The modular vapor deposition system comprises a plurality of different types of discrete modules which are connected together to form a system. Modules may be added to or removed from the system as desired to produce different types of semiconductor photoelectric devices. A preferred embodiment of the modular system 10 includes: an entrance load lock module 14, a first isolation module 16 connected in series with entrance load lock module 14, a P-type deposition module 18 connected in series with the first isolation module 16, a second isolation modules 20 connected in series with the P-type deposition module 18, a plurality of I-type deposition modules 22 connected in series with each other and as a group connected in series with second isolation module 20, a third isolation module 24 connected in series with the I-type deposition modules 22, a N-type deposition module 26 connected in series with the third isolation module 24, a fourth isolation module 28 connected in series with the N-type deposition module 26, and an exit load lock module 30 connected in series with and receiving the isolation module 28.

System 10 includes a conveyor system 32 for conveying the discrete sheets of the substrate 12 through the system for the amorphous silicon deposition. Conveyor system 32 includes a separate conveyor 34 associated with each of the modules 14, 16, 18, 20, 22, 24, 26, 28, and 30 respectively. As illustrated in the exit load lock module 30 of FIG. 1, each conveyor 34 has a separate drive 36. Each separate drive has a motor 38 that drives a continuous drive loop 40 trained over a pair of wheels 42. Conveyor system 32 conveys the substrate sheets 12 through the system from load lock module 14 through isolation module 16, the P-type deposition module 18, isolation module 20, I-type deposition modules 22, isolation module 24, N-type deposition module 26, and isolation module 12 to exit load lock module 30 for delivery. The separate conveyors 34 and their independently operable drives 36 permit the substrate sheets 12 to be conveyed into, through and out of each individual module independent of the speed with which the sheets are conveyed into, through, and out of any other module in the system. It should be noted that according to the present invention, amorphous silicon can be deposited on the upper and lower surfaces of a moving substrate. Deposition on the upper surfaces facilitates the conveyance of the substrate sheets through the system since the lower surfaces can then be used for support. Conversely, deposition on the lower surfaces is advantageous to prevent dust or other particles from settling on the surfaces and preventing uniform deposition.

Each of the modules has an entrance port through which the substrate sheets are received and an exit port through which the substrate sheets are transported to the next module. The exit port of a preceding module and the entrance port of the next module to which it is serially connected from a passageway between the two modules through which the substrate sheets are transported from one module to the other.

The system 10 also includes a plurality of independently operable gate valves 44 which in their closed state, seal the passageways between the individual modules, effectively isolating each module from the adjacent module to which it is connected. In their open state, the gate valves 44 permit the substrate sheets to be conveyed from one module to the other through the interconnecting passageway. The gate valve 44 at the left end of the entrance load lock module 14 functions as a system entrance gate valve and the gate valve 44 at the right end of the exit load lock module 30 functions as a system exit gate valve. Each of the other gate valves 44 functions as an isolation gate valve which seals the passageway between adjacent modules.

As illustrated in the drawings, the system 10 includes a source 46, which supplies a flow of a decomposable silicon gas, such as silane, to which a P-type dopant gas is added to the deposition module 18 at a predetermined pressure. The decomposable silicon gas and the P-type dopant gas are fed through a conduit 48 to the deposition module 18 where it is decomposed by a glow discharge to deposit a P-type layer of amorphous silicon on the surface of the discrete substrate sheets as they pass therethrough. System 10 also has a supply 50 of a decomposable silicon gas free of any dopants. A continuous flow of this gas is fed through conduit 52 to the I-type deposition modules 22 at a constant pressure, where it is used to deposit an intrinsic (I-type) layer of amorphous silicon onto the discrete sheets. The I-type layer of amorphous silicon is deposited on the preexisting layer of P-type amorphous silicon.

It is noted that the I-type or intrinsic layer normally has a greater thickness than the P-type layer for the resultant semiconductor device to function most efficiently. Greater thicknesses of the I-type layers of amorphous silicon can be deposited by a slower rate of conveyance, a greater rate of deposition, the use of two or more of the modules for the I-type vacuum deposition, oscillation of the substrate sheets 12 during the I-type deposition, and/or a combination of the preceding features. Because the rate of conveyance of the substrate sheets through the I-type deposition module is normally much slower than with the P-type or N-type deposition modules, the substrate sheets are fed into the I-type deposition module at time intervals shorter than the length of time required to deposit a layer of intrinsic amorphous silicon having the desired thickness. Therefore, the I-type deposition module will normally have more than one substrate sheet therein at all times.

System 10 also includes a source 54 of a decomposable silicon gas to which is added an N-type dopant for providing through a conduit 56 a continuous flow of this gas mixture to the N-type deposition module 26. This gas mixture is decomposed by a glow discharge to deposit a layer of an N-type amorphous silicon on the I-type amorphous silicon layer of each of the substrate sheets 12.

The gas sources 46, 50 and 54 are controlled to provide a positive gas flow through their respective deposition modules and to maintain their respective decomposable silicon gas at a constant pressure at all times.

From the above description it can be seen that the modular deposition system deposits successive layers of P-type, I-type and N-type amorphous silicon on each of the discrete sheets as the sheets are conveyed through the system from the entrance load lock module 14 to the exit load lock module 30. This series of successive depositions of P-type, I-type and N-type amorphous silicon produces PIN type semiconductor devices.

In each of the deposition modules 18, 22 and 24, deposition of amorphous silicon is accomplished by decomposing the processing gas. This deposition is preferably performed by Chemical Vapor Deposition (CVD) in which the silicon gas is decomposed by a glow discharge. However, it is also possible to perform the deposition by Microwave Enhanced Glow Discharge CVD, Photo-Enhanced Glow Discharge CVD, Sputtering Glow Discharge, or any other type of conventional glow discharge chemical vapor deposition method.

System 10 also includes a source 58 of a back-fill gas that intermittently feeds a back-fill gas through conduits 60 to the isolation modules 16, 20, 24 and 28 as is hereinafter more fully described. A back-fill gas such as hydrogen that is compatible with the P, I, and N-type processing gases may be utilized. It is also possible for the back-fill gas of the isolation modules associated with each deposition module to be the same as the processing gas used in the deposition module. However, the expense of using a processing gas to back-fill the isolation modules is greater and the possibility of the processing gas escaping is of greater concern.

The P-type deposition module 18, the I-type deposition modules 22, and the N-type deposition module 26 are each connected to either an individual or a common vacuum source (not shown). A vacuum source 64, is connected by conduits 66 to the entrance load lock module 14, the isolation modules 16, 20, 24, and 28, and the exit load lock module 30 to intermittently evacuate the modules for removal of gas therefrom during the operation of the system.

A control 68 of the system 10 coordinates operation of the individual conveyors 34, the gate valves 44, the back-fill gas source 58 to the isolation modules 16, 20, 24, and 28, and the vacuum source 64 for evacuating the entrance load lock module 14, the isolation modules 16, 20, 24, and 28, and the exit load lock module 30. The control 68 also controls the operation of the gate valves 44 to prevent contamination and provides generally constant pressure as each substrate sheet 12 is conveyed into, through, and out of the associated deposition module.

The maintenance of a constant pressure in the deposition modules permits the operation of the glow discharge in each deposition module to be continuous and uninterrupted by the transport of the substrate sheets into and out from the deposition modules. The glow discharge continually decomposes the processing gas for the chemical vapor deposition thereby eliminates nonuniformity resulting from the commencement and termination of the glow discharge. The maintenance of the constant pressure in the deposition module is accomplished by back-filling the isolation module upstream from each deposition module with the back-fill gas to substantially the same pressure as the pressure in the deposition module prior to opening of the associated gate valve 44 for conveyance of the substrate sheet into the deposition module. In a like manner, the down stream isolation module is back-filled to substantially the same pressure as the pressure in the deposition module prior to opening of the gate valve for conveyance of the substrate sheet from the deposition module prior to opening associated gate valve 44.

The control 68 of the system 10 includes a first control portion 70 having connections 72 to the drive motor 38 of the drive 36 of each conveyor 34 in order to provide independent control of the speed of each conveyor. Control 68 also includes a second control portion 74 having suitable connections 76 to the gate valves 44 to provide opening and closing of each gate valve in predetermined sequences to permit the uninterrupted transport of the substrate sheets through the system. A third control portion 78 of control 68 has connections 80 for controlling valves 82 that control the back-fill gas from source 58 through conduits 60 to the isolation modules 16, 20, 24, and 28. A fourth control portion 84 of control 68 has connections 86 to valves 88 that control the vacuum drawn through the conduits 66 in the entrance load lock module 14, the isolation modules 16, 20, 24, and 28, and the exit load lock module 30.

Figure 2:
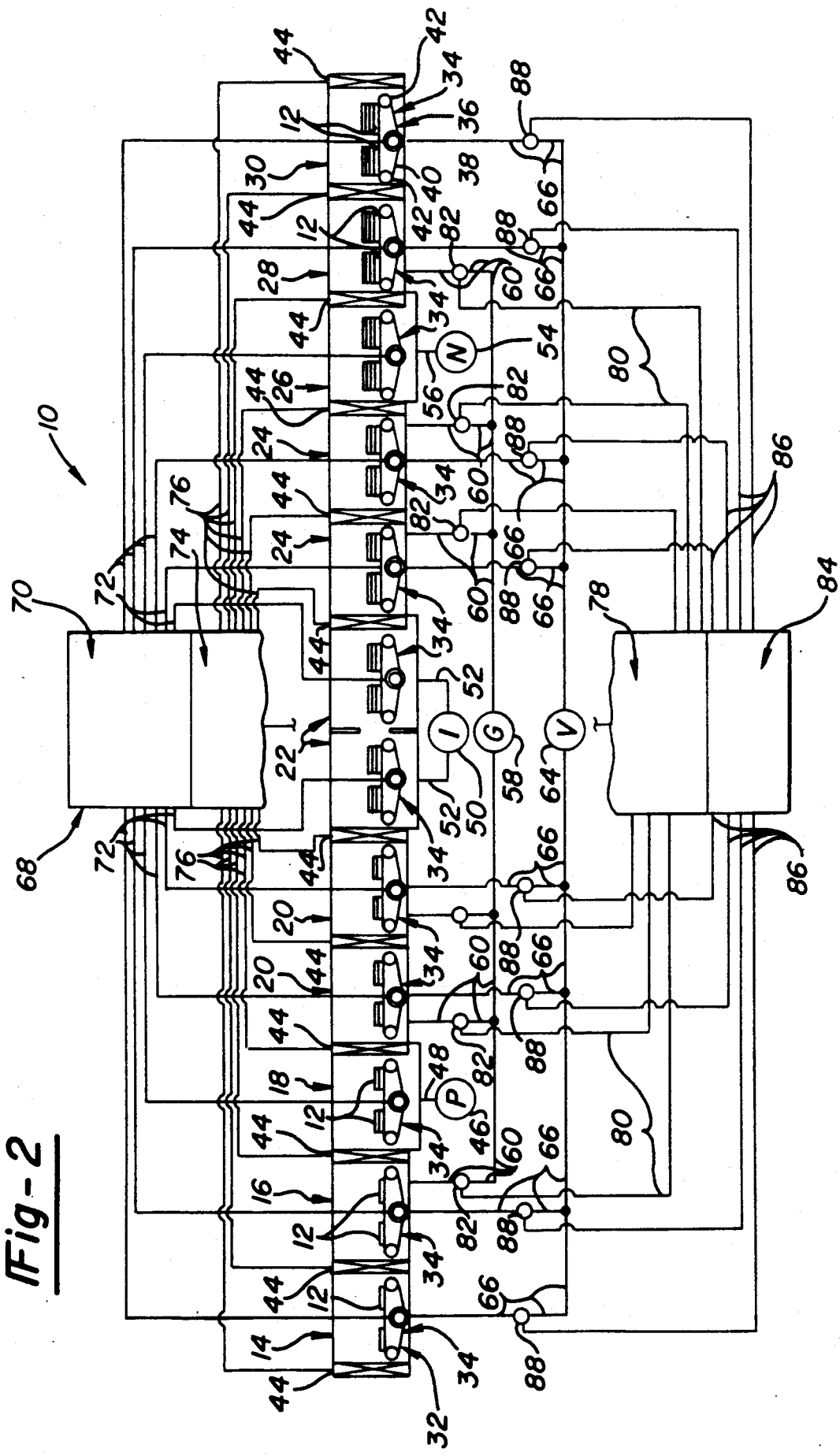
FIG. 2 is a schematic view of an alternative embodiment of a modular continuous vapor deposition system constructed in accordance with the present invention.

In an alternative embodiment of the present invention, two or more isolation modules are placed between the P-type deposition module and the I-type deposition module, and the I-type deposition module and N-type deposition module, respectively. With reference to FIG. 2, it can be seen that isolation modules 20 are connected in a series with each other, and as a group connected in series with the P-type deposition module 18. As in FIG. 1, a plurality of I-type deposition modules 22 are connected in series with each other, and as a group connected in series with isolation modules 20. Similarly, isolation modules 24 are connected in series with each other, and as a group connected in series with the I-type deposition modules 22. The N-type deposition module 26 is thereafter connected in series with the isolation modules 24.

The additional isolation modules provided for in the alternative embodiment operate in the same manner as disclosed in FIG. 1, and are further separated from each other and the other modules by gate valves 44. The presence of additional isolation chambers in the system between the deposition modules reduces cross-contamination of the processing gases between the deposition modules, thereby increasing the purity of each of the deposited layers of amorphous silicon.

OPERATION

The operation of the modular continuous vapor deposition system 10 is described below with respect to a discrete glass substrate sheet 12 onto which the semiconductor material is to be deposited to make a PIN semiconductor device. Each cycle begins by placing the substrate sheet 12 into the entrance load lock module, closing the gate valve, then activating the vacuum source 64 to draw a vacuum within the entrance load lock module 14 to remove the contamination of the environmental atmosphere.

First isolation module 16 is then evacuated by the vacuum source 64 to remove any gas therein from the previous cycle, then opening the gate valve 44 between the entrance load lock module 14 and the first isolation module 16. This permits the substrate sheet 12 to be conveyed into the isolation module 16. The gate valve 44 between entrance load lock module 14 and 16 is then closed and the isolation module 16 is filled with the back-fill gas from source 58 to a pressure substantially equal to the pressure in deposition module 18 prior to opening of the gate valve 44 between the first isolation module 16 and the deposition module 18. As previously indicated, the pressure of the P-type processing gas in deposition module 18 is always maintained at a predetermined value when the system is in operation.

After the substrate sheet is conveyed by the conveyor 34 of the first isolation module 16 to the conveyor 34 in the P-type deposition module 18, the deposition of the layer of amorphous silicon having P-type conductivity takes place. This deposition is continuous as the substrate sheet is conveyed into, through and out of the P-type deposition module 18. The gate valve 44 between first isolation module 16 and the P-type deposition module 18 is subsequently closed after the substrate has passed into the P-type deposition module 18 in order to permit the first isolation module 16 to be prepared for the next substrate sheet. As the P-type deposition continues, the second isolation module 20 is filled with the back-fill gas from source 58 to a pressure substantially equal to the pressure in deposition module 18, with the gate valve 44 between the P-type deposition module 18 and the second isolation module 20 being closed. This gate valve 44 is subsequently opened after completion of the deposition of the P-type amorphous silicon layer. The substrate sheet 12 with the layer of P-type amorphous silicon deposited thereon is then conveyed by the associated conveyor 34 from the P-type deposition module 18 into the second isolation module 20 while the glow discharge decomposition of the processing gas in module 18 continues.

It will thus be noted that the substrate sheet upon conveyance into, through, and out of the vacuum deposition module 18 is continually subjected to a generally constant pressure so as to permit the uninterrupted decomposition of the processing gas by a glow discharge which provides a uniform deposition of the P-type semiconductor layer and also prevent cross-contamination of gases between the different modules.

Commencement of the deposition of the intrinsic layer of amorphous silicon is initiated by evacuating the second isolation module 20 of any gas therein and then back-filling the isolation module 20 with the back-fill gas by source 58 to a pressure substantially equal to the pressure in the I-type deposition module 22. After back-filling the second isolation module 20, the gate valve 44 between the second isolation module 20 and the I-type deposition module 22 is opened to permit the conveyor 34 to convey the substrate sheet 12 with the P-type amorphous silicon layer already deposited thereon into the I-type deposition modules 22. As previously indicated, the I-type deposition modules 22 are always filled with a processing gas to which no dopants are added. The I-type deposition takes place as the substrate sheet is conveyed into, through, and out of the I-type deposition modules 22. Once the substrate sheet 12 has been conveyed into the deposition modules 22, the gate valve 44 between the second isolation module 20 and the I-type deposition module 22 is closed so that the second isolation module 20 can be readied for the next substrate sheet to be processed. As set forth above, the I-type deposition module deposits a layer of intrinsic or I-type amorphous silicon over the P-type amorphous silicon layer. The I-type deposition module deposits a layer of amorphous silicon onto the substrate sheet which is substantially thicker than the P-type amorphous silicon. This thicker layer of I-type amorphous silicon may be deposited by two or more serially connected I-type deposition modules, as previously indicated.

Since the I-type amorphous silicon layer may be substantially thicker than either the P-type or the N-type layers, the conveyor 34 may be moving at a substantially slower rate. Because the input or removal of the substrate sheets from the I-type deposition module does not interrupt the deposition of the intrinsic amorphous silicon, it is possible to feed substrate sheets into the I-type deposition at time intervals shorter than the deposition time. As a result, two or more substrate sheets may reside in the I-type deposition module 22 at any given time. Preferably, the feeding of the substrate sheets into the I-type deposition module are timed by the controller, so that there is minimal spacing between successive substrate sheets. This optimizes the utilization of the processing gas.

Before the I-type deposition is complete, the third isolation module 24 is evacuated of any gas by the vacuum source 64, then back-filled with back-fill gas from source 58. Thereafter, gate valve 44 between the I-type deposition module 22 and the third isolation module 24 is opened to allow conveyance of the substrate sheet 12 with the P and I-type layers of amorphous silicon deposited thereon into third isolation module 24. After the substrate sheet is transported into the third isolation module 24, the gate valve 44 between the I-type deposition module 22 and the third isolation module 24 is closed.

The I-type vacuum deposition system disclosed herein is maintained at a generally constant pressure at all times. Thus, continual decomposition of the processing gas by the glow discharge is permitted and provides an uniform deposition of the I-type amorphous silicon layer. In addition, the second and third isolation modules prevent cross-contamination between P-type deposition module and the I-type deposition module.

The deposition of the N-type amorphous silicon layer is initiated by first evacuating the third isolation module 24 of any gas therein. The third isolation module 24 is then back-filled with back-fill gas from source 58. Thereafter, gate valve 44 between the third isolation module 24 and the N-type deposition module 26 is opened to permit the conveyance of the substrate sheet 12 into the N-type deposition module 26. The N-type deposition takes place as the substrate 12 is conveyed into, through, and out of the N-type deposition module 22. While the N-type deposition is in progress, the gate valve 44 between the third isolation module 24 and the N-type deposition module 26 is closed so that the third isolation module 24 can be readied for the next substrate sheet being processed.

Before completion of the N-type deposition, the fourth isolation module 28 is back-filled with back-fill gas from source 58. Thereafter, the gate valve 44 between the N-type deposition module 26 and the fourth isolation module 28 is opened to permit the substrate sheet 12 to be conveyed by the conveyor 34 from the N-type deposition module 26 to the fourth isolation module 28 prior to closing of the gate valve 44 therebetween. The N-type deposition is performed with the pressure in the N-type deposition module being at constant pressure so as to permit the continual processing gas decomposition by the glow discharge which provides a uniform deposition of the N-type amorphous silicon.

Delivery of the completed semiconductor device after the deposition of the N-type layer is accomplished by evacuating the isolation module 28 and exiting load lock module 30 of any gas and then opening gate valve 44 between the fourth isolation module 28 and the exit load lock module 30 for conveyance of the completed semiconductor device into the exit load lock module 30. Thereafter, the gate valve 44 between the fourth isolation module 28 and the load lock module 30 is closed and the exit load lock module 30 is returned to atmospheric pressure. The exit gate valve 44 of the exit load lock module 30 is then opened to permit the conveyance of the completed semiconductor device out of the system for delivery or further processing.

In the alternative embodiment disclosed in FIG. 2, the system operates in much the same manner as in FIG. 1, with one significant difference. Gate valve 44 located between the individual isolation modules 20 and 24, respectively, will always remain closed at any time in which both the input port of an isolation module, and the exit port of the next succeeding isolation module are simultaneously open.

While the best mode for carrying out the invention has been described in detail, those familiar with the art to which this invention relates will recognize various alternative designs and embodiments for practicing the invention as defined by the following claims.

What is claimed is:

1. A modular vapor deposition system for depositing amorphous silicon on discrete glass sheets to form semiconductor devices as the glass sheets are continuously transported through the deposition system, comprising:
   a first deposition module having an input port and an exit port;
   a first gas source for supplying a flow of decomposable silicon gas through said first deposition module at a predetermined pressure;
   a first conveyor for transporting the glass sheets through said first deposition module at a first predetermined velocity;
   a first glow discharge apparatus for generating a glow discharge in said first deposition module to decompose said silicon gas and to deposit a layer of amorphous silicon of a first predetermined thickness on the glass sheets as the glass sheets are transported through said first deposition module at said first predetermined velocity;
   an input valve having a closed state sealing said input port of said first deposition module and an open state allowing the glass sheets to be received in said first deposition module;
   a first isolation module having an input port sealingly connected to said exit port of said first deposition module to form a first exit passageway and an exit port;
   a first exit valve having a closed state sealing said first exit passageway to isolate said first deposition module from said first isolation module and an open state permitting the glass sheets to be transported by said first conveyor into said first isolation module;
   a second exit valve having a closed state sealing said exit port of said first isolation module and an open state permitting the glass sheets to be transported through said exit port of said first isolation module;
   a second conveyor for transporting the glass sheets through said first isolation module and through said exit port of said first isolation module at a second predetermined velocity when said second exit valve is in said open state;
   a second isolation module having an input port sealingly connected to said exit port of said first isolation module to form a second exit passageway and an exit port;
   a third exit valve having a closed state sealing said exit port of said second isolation module and an open state permitting the glass sheets to be transported through said exit port of said second isolation module;
   a third conveyor for transporting the glass sheets through said second isolation module and through said exit port of said second isolation module at a third predetermined velocity when said third exit gate valve is in said open state;
   a second deposition module having an input port sealingly connected to said exit port of said third isolation module to form a third exit passageway and an exit port;
   a second gas source for supplying a flow of decomposable silicon gas through said second deposition module at a pressure substantially equal to said predetermined pressure;
   a fourth conveyor for transporting the glass sheets through said second deposition module at a fourth predetermined velocity;
   a second flow discharge apparatus for generating an uninterrupted glow discharge in said second deposition module to deposit a second layer of amorphous silicon of a second predetermined thickness on the glass sheets by the decomposition of said silicon gas by said glow discharge as the glass sheets are transported through said second deposition module at said fourth predetermined velocity;
   a third isolation module having an input port sealingly connected to said exit port of said second deposition module to form a fourth exit passageway and an exit port;
   a fifth conveyor for transporting said glass sheets through said third isolation module at a fifth predetermined velocity;
   a fourth exit valve having a closed state sealing said fourth exit passageway to isolate said second deposition module from said third isolation module and an open state permitting the glass sheets to be transported by said fourth conveyor into said third isolation module;
   a fourth isolation module having an input port sealingly connected to the exit port of said third isolation module to form a fifth exit passageway and an exit port;
   a fifth exit valve having a closed state and an open state permitting the glass sheets to be transported by said fifth conveyor into said fourth isolation module;
   a sixth exit valve having a closed state sealing said exit port of said fourth isolation module and an open state permitting the glass sheets to be transported through said exit port of said fourth isolation module;
   a sixth conveyor for transporting the glass sheets through said fourth isolation module and through said exit port of said fourth isolation module at a sixth predetermined velocity;

a third deposition module having an inlet port sealingly connected to the exit port of said fourth isolation module to form a sixth exit passageway and an exit port;

a seventh conveyor for conveying the glass sheets through said third deposition module at a seventh predetermined velocity;

a third gas source for supplying a flow of decomposable silicon gas through said third deposition module at a pressure substantially equal to said predetermined pressure;

a third glow discharge apparatus for generating an uninterrupted glow discharge in said third deposition module to deposit a third layer of amorphous silicon of a third predetermined thickness on said glass sheets by the decomposition of a decomposable silicon gas by said glow discharge as said glass sheets are transported through said third deposition module at said seventh predetermined velocity;

a vacuum system for evacuating said first, second, third and fourth isolation modules;

a back-fill gas source for back-filling said first, second, third and fourth isolation modules with a back-fill gas to a pressure substantially equal to said predetermined pressure of said silicon gas in said first deposition module; and a control for activating said vacuum system and said back-fill gas source to periodically evacuate and backfill said first, second, third and fourth isolation modules with said back-fill gas in a predetermined sequence and for opening and closing said input valve, said first, second, third, fourth, fifth and sixth exit valves in coordination with the evacuation and back-filling of said first, second, third and fourth isolation modules to permit the glass sheets to be continuously transported through said first, second, third and fourth isolation modules and said first, second and third deposition modules by said first, second, third, fourth, fifth, sixth and seventh conveyors at their respective predetermined velocities while maintaining the pressure of said decomposable silicon gas in said first, second, and third deposition modules at substantially the same pressure as said predetermined pressure so that the first, second, and third amorphous silicon layers of the glass sheets is deposited to said first predetermined thickness, said second predetermined thickness, and said third predetermined thickness in accordance with said first predetermined velocity, said fourth predetermined velocity, and said seventh predetermined velocity while not interrupting said glow discharge.

2. The deposition system of claim 1 wherein said second deposition module comprises at least two second deposition modules serially connected to each other.

3. A modular vapor deposition system as in claim 1, further comprising:

a fifth isolation module having an exit port sealingly connected to the input port of said first deposition module to form a seventh exit passageway and having an input port;

an entrance valve having a closed state sealing said input port of said fifth isolation module and an open state allowing the glass sheets to be received in said fifth isolation module;

an eighth conveyor for transporting the glass sheets through said fifth isolation module at an eighth predetermined velocity and into said first deposition module when said input valve is in said open state; and wherein said control further activates said vacuum system and said back-fill gas source to periodically evacuate and back-fill said first, second, third, fourth and fifth isolation modules with said back-fill gas in a predetermined sequence to open and close said entrance valve, said input valve, said first, second, third, fourth, fifth and sixth exit valves in coordination with the evacuation and backfilling of said first, second, third, fourth and fifth isolation modules to permit the glass sheets to be continuously transported through said first, second, third, fourth and fifth isolation modules and said first, second and third deposition modules by said first, second, third, fourth, fifth, sixth, seventh and eighth conveyors at their respective predetermined velocities while maintaining the pressure of said decomposable silicon gas in said first, second and third deposition modules at substantially the same pressure as said predetermined pressure so that the first, second and third amorphous silicon layers of the glass sheets is deposited to said first predetermined thickness, said second predetermined thickness, and said third predetermined thickness in accordance with said first predetermined velocity, said fourth predetermined velocity, and said seventh predetermined velocity while not interrupting said glow discharge.

4. A modular vapor deposition system as in claim 3, further comprising:

a sixth isolation module having an input port sealingly connected to said exit port of said third deposition module to form an eighth exit passageway and an exit port;

a ninth conveyor for transporting the glass sheets through said sixth isolation module;

a seventh exit valve having a closed state sealing said eighth exit passageway to isolate said third deposition module from said sixth isolation module and an open state permitting the glass sheets to be transported by said seventh conveyor into said sixth isolation module; and wherein said control further activates said vacuum system and said back-fill gas source to periodically evacuate and back-fill said first, second, third, fourth, fifth and sixth isolation modules with said back-fill gas in a predetermined sequence to open and close said input valve, said entrance valve, said first, second, third, fourth, fifth, sixth and seventh exit valves in coordination with the evacuation and back-filling of said first, second, third, fourth, fifth and sixth isolation modules to permit the glass sheets to be continuously transported through said first, second, third, fourth, fifth and sixth isolation modules and said first, second and third deposition modules by said first, second, third, fourth, fifth, sixth, seventh, eighth and ninth conveyors at their respective predetermined velocities while maintaining the pressure of said decomposable silicon gas in said first, second and third deposition modules at substantially the same pressure as said predetermined pressure so that the first, second and third amorphous silicon layers of the glass sheets is deposited to said first predetermined thickness, said second predetermined thickness, and said third predetermined thickness in accordance with said first predetermined velocity, said fourth predetermined velocity, and said seventh predetermined velocity while not interrupting said glow discharge.

5. A modular vapor deposition system for depositing amorphous silicon on discrete substrate sheets as the substrate sheets are continuously transported through the deposition system, comprising:

a first deposition module having an input port and an exit port;

a first gas source for supplying a flow of decomposable silicon gas through said first deposition module at a predetermined pressure;

a first conveyor for transporting the discrete substrate sheets through said first deposition module at a first predetermined velocity;

a first glow discharge apparatus for generating a glow discharge in said first deposition module to decompose said silicon gas and to deposit a layer of amorphous silicon of a first predetermined thickness on the discrete substrate sheets as the discrete substrate sheets are transported through said first deposition module at said first predetermined velocity;

an input valve having a closed state sealing said input port of said first deposition module and an open state allowing the discrete substrate sheets to be received in said first deposition module;

a first isolation module having an input port sealingly connected to said exit port of said first deposition module to form a first exit passageway and an exit port;

a first exit valve having a closed state sealing said first exit passageway to isolate said first deposition module from said first isolation module and an open state permitting the discrete substrate sheets to be transported by said first conveyor into said first isolation module;

a second exit valve having a closed state sealing said exit port of said first isolation module and an open state permitting the glass sheets to be transported through said exit port of said first isolation module;

a second conveyor for transporting the glass sheets through said first isolation module and through said exit port of said first isolation module at a second predetermined velocity when said second exit valve is in said open state;

a second isolation module having an input port sealingly connected to said exit port of said first isolation module to form a second exit passageway and an exit port;

a third exit valve having a closed state sealing said exit port of said second isolation module and an open state permitting the glass sheets to be transported through said exit port of said second isolation module;

a third conveyor for transporting the discrete substrate sheets through said second isolation module and through said exit port of said second isolation module at a third predetermined velocity when said third exit valve is in said open state;

a second deposition module having an input port sealingly connected to said exit port of said third isolation module to form a third exit passageway and an exit port;

a second gas source for supplying a flow of decomposable silicon gas through said second deposition module at a pressure substantially equal to said predetermined pressure;

a fourth conveyor for transporting the discrete substrate sheets through said second deposition module at a fourth predetermined velocity;

a second glow discharge apparatus for generating an uninterrupted glow discharge in said second deposition module to deposit a second layer of amorphous silicon of a second predetermined thickness on the discrete substrate sheets by the decomposition of said silicon gas by said glow discharge as the discrete substrate sheets are transported through said second deposition module at said fourth predetermined velocity;

a third isolation module having an input port sealingly connected to said exit port of said second deposition module to form a fourth exit passageway and an exit port;

a fifth conveyor for transporting said discrete substrate sheets through said third isolation module at a fifth predetermined velocity;

a fourth exit valve having a closed state sealing said fourth exit passageway to isolate said second decomposition module from said third isolation module and an open state permitting the discrete substrate sheets to be transported by said fourth conveyor into said third isolation module;

a fourth isolation module having an input port sealingly connected to the exit port of said third isolation module to form a fifth exit passageway and an exit port;

a fifth exit valve having a closed state and an open state permitting the discrete substrate sheets to be transported by said fifth conveyor into said fourth isolation module;

a sixth exit valve having a closed state sealing said exit port of said fourth isolation module and an open state permitting the discrete substrate sheets to be transported through said exit port of said fourth isolation module;

a sixth conveyor for transporting the discrete substrate sheets through said fourth isolation module and through said exit port of said fourth isolation module at a sixth predetermined velocity;

a third deposition module having an input port sealingly connected to the exit port of said fourth isolation module to form a sixth exit passageway and an exit port;

a seventh conveyor for conveying the discrete substrate sheets through said third deposition module at a seventh predetermined velocity;

a third gas source for supplying a flow of decomposable silicon gas through said third deposition module at a pressure substantially equal to said predetermined pressure;

a third glow discharge apparatus for generating an uninterrupted glow discharge in said third deposition module to deposit a third layer of amorphous silicon of a third predetermined thickness on said discrete substrate sheets by the decomposition of a decomposable silicon gas by said glow discharge as said discrete substrate sheets are transported through said third deposition module at said seventh predetermined velocity;

a vacuum system for evacuating said first, second, third and fourth isolation modules;

a back-fill gas source for back-filling said first, second, third and fourth isolation modules with a back-fill gas to a pressure substantially equal to said predetermined pressure of said silicon gas in said first deposition module; and a control for activating said vacuum system and said back-fill gas source to periodically evacuate and backfill said first, second, third and fourth isolation modules with said back-fill gas in a predetermined sequence and for opening and closing said input valve, said first, second, third, fourth, fifth and sixth exit valves in coordination with the evacuation and back-filling of said first, second, third and fourth isolation modules to permit the discrete substrate sheets to be continuously transported through said first, second, third and fourth isolation modules and said first, second, and third deposition modules by said first, second, third, fourth, fifth, sixth and seventh conveyors at their respective predetermined velocities while maintaining the pressure of said decomposable silicon gas in said first, second, and third deposition modules at substantially the same pressure as said predetermined pressure so that the first, second, and third amorphous silicon layers of the discrete substrate sheets is deposited to said first predetermined thickness, said second predetermined thickness, and said third predetermined thickness in accordance with said first predetermined velocity, said fourth predetermined velocity, and said seventh predetermined velocity while not interrupting said glow discharge.

6. The deposition system of claim 5 wherein said substrate sheet is a glass sheet.

7. A modular vapor deposition system as in claim 5, further comprising:

a fifth isolation module having an exit port sealingly connected to the input port of said first deposition module to form a seventh exit passageway and having an input port;

an entrance valve having a closed state sealing said input port of said fifth isolation module and an open state allowing the discrete substrate sheets to be received in said fifth isolation module;

an eighth conveyor for transporting the discrete substrate sheets through said fifth isolation module at an eighth predetermined velocity and into said first deposition module when said input valve is in said open state; and wherein said control further for activates said vacuum system and said back-fill gas source to periodically evacuate and back-fill said first, second, third, fourth and fifth isolation modules with said back-fill gas in a predetermined sequence to open and close said entrance valve, said input valve, said first, second, third, fourth, fifth and sixth exit valves in coordination with the evacuation and backfilling of said first, second, third, fourth and fifth isolation modules to permit the discrete substrate sheets to be continuously transported through said first, second, third, fourth and fifth isolation modules and said first, second and third deposition modules by said first, second, third, fourth, fifth, sixth, seventh and eighth conveyors at their respective predetermined velocities while maintaining the pressure of said decomposable silicon gas in said first, second and third deposition modules at substantially the same pressure as said predetermined pressure so that the first, second and third amorphous silicon layers of the discrete substrate sheets is deposited to said first predetermined thickness, said second predetermined thickness, and said third predetermined thickness in accordance with said first predetermined velocity, said fourth predetermined velocity, and said seventh predetermined velocity while not interrupting said glow discharge.

8. A modular vapor deposition system as in claim 7, further comprising:

a sixth isolation module having an input port sealingly connected to said exit port of said third deposition module to form an eighth exit passageway and an exit port;

a ninth conveyor for transporting the discrete substrate sheets through said sixth isolation module;

a seventh exit valve having a closed state sealing said eighth exit passageway to isolate said third deposition module from said sixth isolation module and an open state permitting the discrete substrate sheets to be transported by said seventh conveyor into said sixth isolation module; and wherein said control further activates said vacuum system and said back-fill gas source to periodically evacuate and back-fill said first, second, third, fourth, fifth and sixth isolation modules with said back-fill gas in a predetermined sequence to open and close said input valve, said entrance valve, said first, second, third, fourth, fifth, sixth and seventh exit valves in coordination with the evacuation and back-filling of said first, second, third, fourth, fifth and sixth isolation modules to permit the discrete substrate sheets to be continuously transported through said first, second, third, fourth, fifth and sixth isolation modules and said first, second and third deposition modules by said first, second, third, fourth, fifth, sixth, seventh, eighth and ninth conveyors at their respective predetermined velocities while maintaining the pressure of said decomposable silicon gas in said first, second and third deposition modules at substantially the same pressure as said predetermined pressure so that the first, second and third amorphous silicon layers of the discrete substrate sheets is deposited to said first predetermined thickness, said second predetermined thickness, and aid third predetermined thickness in accordance with said first predetermined velocity, said fourth predetermined velocity, and said seventh predetermined velocity while not interrupting said glow discharge.

9. A modular vapor deposition system as in claims 3 or 7 wherein said entrance valve is a gate valve.

10. A modular vapor deposition system as in claims 4 or 8 wherein said seventh exit valve is a gate valve.

11. The deposition system of claim 12 wherein said decomposable silicon gas in silane.

12. The deposition system of claim 13 wherein said first gas source has said P-type dopant gas mixed with its decomposable silicon gas and said third gas source has said N-type dopant gas mixed with its decomposable silicon gas.

13. The deposition system of claim 1 or 5 wherein one of said first and third gas sources provides a decomposable silicon gas mixed with a P-type dopant gas to its associated deposition module and the other of said first and third gas sources provides a decomposable silicon gas with an N-type dopant gas to its associated deposition module.

14. The deposition system of claim 1 or 5 wherein one of said first and second gas sources provides a decomposable silicon gas mixed with a P-type dopant gas to its associated deposition module and the other of said first and second gas sources provides a decomposable silicon gas with an N-type dopant gas to its associated deposition module.

15. A modular vapor deposition system as in claims 1 or 5 wherein said input valve is a gate valve.

16. A modular vapor deposition system as in claims 1 or 5 wherein at least one of said first, second, third, fourth, fifth and sixth exit valves is a gate valve.

* * * * *